United States Patent [19]
Furuno

[11] Patent Number: 6,119,337
[45] Date of Patent: Sep. 19, 2000

[54] METHOD OF MOUNTING CONDUCTIVE BALLS

[75] Inventor: Kouji Furuno, Dazaifu, Japan

[73] Assignee: Matsushita Electric Industrial Co., Ltd., Osaka, Japan

[21] Appl. No.: 09/258,899

[22] Filed: Mar. 1, 1999

[30] Foreign Application Priority Data

Mar. 10, 1998 [JP] Japan ................................... 10-057797

[51] Int. Cl.⁷ .................................................. A05K 3/30
[52] U.S. Cl. .......................... 29/832; 29/402.01; 29/740; 29/833; 29/840
[58] Field of Search .............................. 29/739, 740, 840, 29/832, 833, 402.01

[56] References Cited

U.S. PATENT DOCUMENTS

| | | |
|---|---|---|
| 4,247,203 | 1/1981 | Levy et al. . |
| 5,108,024 | 4/1992 | Kazem-Goudarzi et al. . |
| 5,291,535 | 3/1994 | Baker et al. . |
| 5,574,801 | 11/1996 | Collet-Beillon . |

FOREIGN PATENT DOCUMENTS 9-022929  1/1997  Japan .

Primary Examiner—Carl J. Arbes
Attorney, Agent, or Firm—Stevens, Davis, Miller & Mosher, L.L.P.

[57] ABSTRACT

A workpiece, on which electrically-conductive balls have been mounted by a mounting machine, is inspected by a camera of an inspecting device. The workpiece has a number of conductive ball-mounting areas arranged in a matrix-like pattern. The camera inspects each of the mounting areas independently with respect to the absence of the conductive ball, the misregistration of the conductive ball and the overload of the conductive balls. The defective workpiece, fed from the inspecting device, is stopped at a repair stage, and the operator effects a repairing operation at this repair stage. A monitor television is provided at the repair stage, and a defect category for each mounting area of the workpiece is displayed on a screen of this monitor television, and the operator effects the repairing operation while viewing this screen. Therefore, the burden of labor on the operator is reduced, and the repairing operation for correcting the mounting error can be effected easily and rapidly.

3 Claims, 6 Drawing Sheets

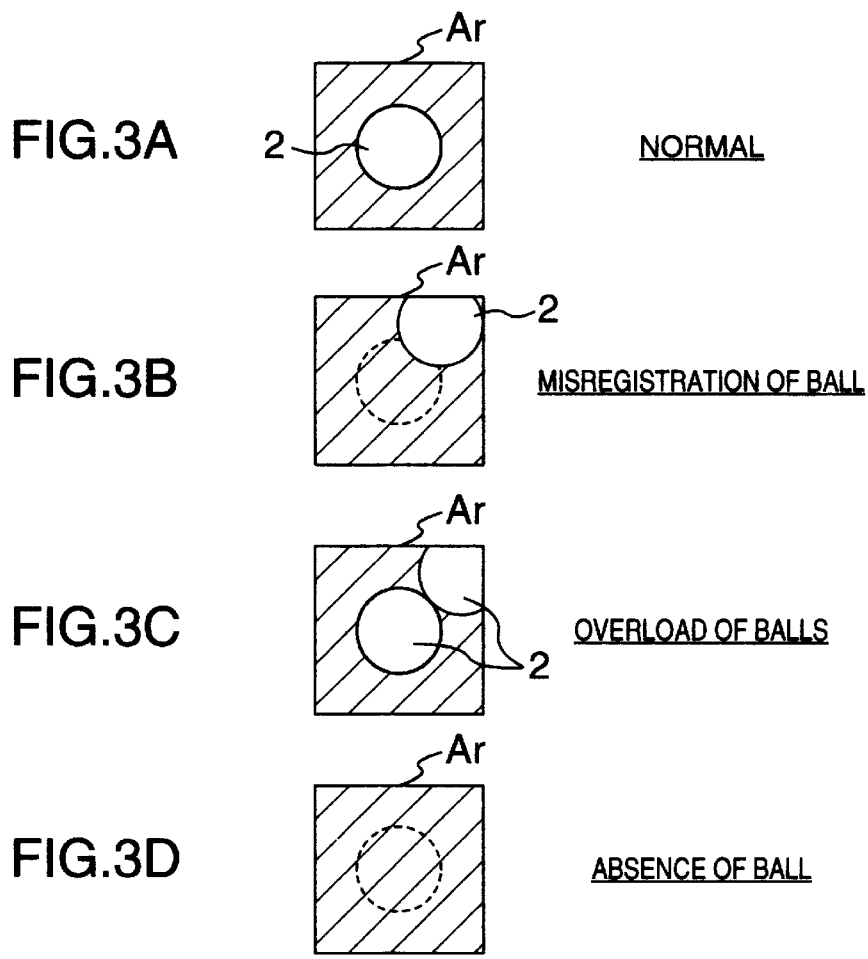

METHOD OF MOUNTING CONDUCTIVE BALLS

BACKGROUND OF THE INVENTION

This invention relates to an apparatus for and a method of mounting electrically-conductive balls, such as solder balls, on a workpiece such as a board and a chip.

RELATED ART

Bumps on a board or a chip are usually formed by electrically-conductive balls such as solder balls. Conductive balls are mounted on a workpiece by a mounting machine, and then the workpiece is fed to a reflow device, and the conductive balls are fixedly secured to the workpiece to form bumps.

The mounting machine mounts a number of conductive balls on the workpiece at a time. In this case, ball-mounting errors are liable to occur. Categories of such errors include the absence (omission) of the conductive ball, the misregistration of the conductive ball, and the overload of the conductive balls. The workpiece, subjected to a mounting error, is a defective product, and therefore must be removed from the workpiece-producing line. Therefore, the inspection has heretofore been effected by the use of an inspecting device (e.g. camera) so as to judge whether each workpiece is good (OK) or not (NG). Then, with respect to the defective (NG) workpiece, the operator observes the conductive ball-mounting areas one by one at a subsequent stage so as to judge whether or not there is any mounting error, and if there is a mounting error, the operator judges which category (the absence, misregistration and overload of the conductive ball) this mounting error belongs to, and the necessary repairing operation is effected.

As described above, the conventional inspecting device does not judge whether or not each of the mounting areas is subjected to any mounting error, but merely judges whether or not the whole of the workpiece is good or not good (defective). With respect to the workpiece found to be defective, the operator precisely inspects the conductive ball-mounting areas of this workpiece one by one, using a microscope, and specifies the mounting area subjected to the mounting error, and judges the category of this mounting error, and effects the repairing operation.

In this conventional method, however, the operator must specify the mounting area subjected to the mounting error, and also must judge the category of the mounting error while observing the workpiece through the microscope. Therefore, there have been encountered problems that the burden of labor on the operator is very large and that the efficiency of the operation is not enhanced.

SUMMARY OF THE INVENTION

It is therefore an object of this invention to provide a conductive ball-mounting apparatus and a conductive ball-mounting method, in which the burden of labor on the operator is reduced, and a repairing operation for correcting a mounting error can be effected easily and rapidly.

According to one aspect of the present invention, there is provided a conductive ball-mounting apparatus comprising:

a mounting machine for mounting a plurality of electrically-conducive balls in a matrix-like pattern on a workpiece;

an inspecting device for optically inspecting the workpiece so as to determine whether or not the conductive balls have been properly mounted on the work-piece; and a repair stage for repairing the workpiece, having a ball-mounting error, so as to correct this ball-mounting error;

wherein the mounting machine, the inspecting device and the repair stage are arranged in this order along a path of transfer of the workpiece;

wherein the inspecting device inspects each of conductive ball-mounting areas of the workpiece, arranged in a matrix-like pattern, independently so as to determine whether or not the conductive ball has been properly mounted on each conductive ball-mounting area;

wherein a monitor television is provided at the repair stage, and results of the inspection, effected by the inspecting device, are displayed on the monitor television, and a repairing operation is effected while viewing the monitor television.

In the mounting apparatus, preferably, retracting means for retracting the defective workpiece from the transfer path is provided at the repair stage, and the defective workpiece is retracted from the transfer path, and is repaired.

In the mounting apparatus, preferably, the inspecting device detects a defect category for each of the mounting areas, the defect categories including the absence of the conductive ball, the misregistration of the conductive ball and the overload of the conductive ball, and results of this inspection are displayed on the monitor television.

According to another aspect of the invention, there is provide a conductive ball-mounting method comprising the steps of:

transferring a workpiece along a transfer path;

mounting a plurality of electrically-conducive balls in a matrix-like pattern on the workpiece by a mounting machine;

optically inspecting the workpiece, fed from the mounting machine, by an inspecting device with respect to each of conductive ball-mounting areas of the workpiece so as to determine whether or not the conductive balls have been properly mounted respectively on the conductive ball-mounting areas; and once stopping the defective workpiece, fed from the inspecting device, at a repair stage, and retracting the defective workpiece from the transfer path by retracting means, and displaying results of the inspection, effected by the inspecting device, on a monitor television provided at the repair stage, and repairing the defective workpiece while viewing the monitor television.

In the mounting method, preferably, the inspecting device detects a defect category for each of the mounting areas, the defect categories including the absence of the conductive ball, the misregistration of the conductive ball and the overload of the conductive ball, and results of this inspection are displayed on the monitor television.

In the mounting method, preferably, during the repairing operation in which the defective workpiece is retracted from the transfer path, and repaired on the repair stage, a subsequent good workpiece is transferred downstream past auxiliary rails.

In the present invention, the operator can effect the repairing operation while viewing the screen of the monitor television provided at the repair stage. In this case, the presence or absence of the mounting error and the category of the mounting error for each of the mounting areas, arranged in a matrix-like pattern, are displayed on the screen of the monitor television, and therefore the operator does not need to observe the work-piece through a microscope as in the conventional method, and the operator can effect the repairing operation easily and rapidly.

BRIEF DESCRIPTION OF THE DRAWINGS

FIG. 3A is a view showing an image of a work-piece (in a normal condition) picked up by a camera in the conductive ball-mounting apparatus of the embodiment;

FIG. 3B is a view showing an image of a work-piece (subjected to a mounting error (misregistraton of the ball)) picked up by the camera in the conductive ball-mounting apparatus of the embodiment;

FIG. 3C is a view showing an image of a work-piece (subjected to a mounting error (overload of the balls)) picked up by the camera in the conductive ball-mounting apparatus of the embodiment;

FIG. 3D is a view showing an image of a work-piece (subjected to a mounting error (absence of the ball)) picked up by the camera in the conductive ball-mounting apparatus of the embodiment;

FIG. 4 is a view showing a screen of a monitor television in the embodiment;

DESCRIPTION OF THE PREFERRED EMBODIMENT

Figure 1:
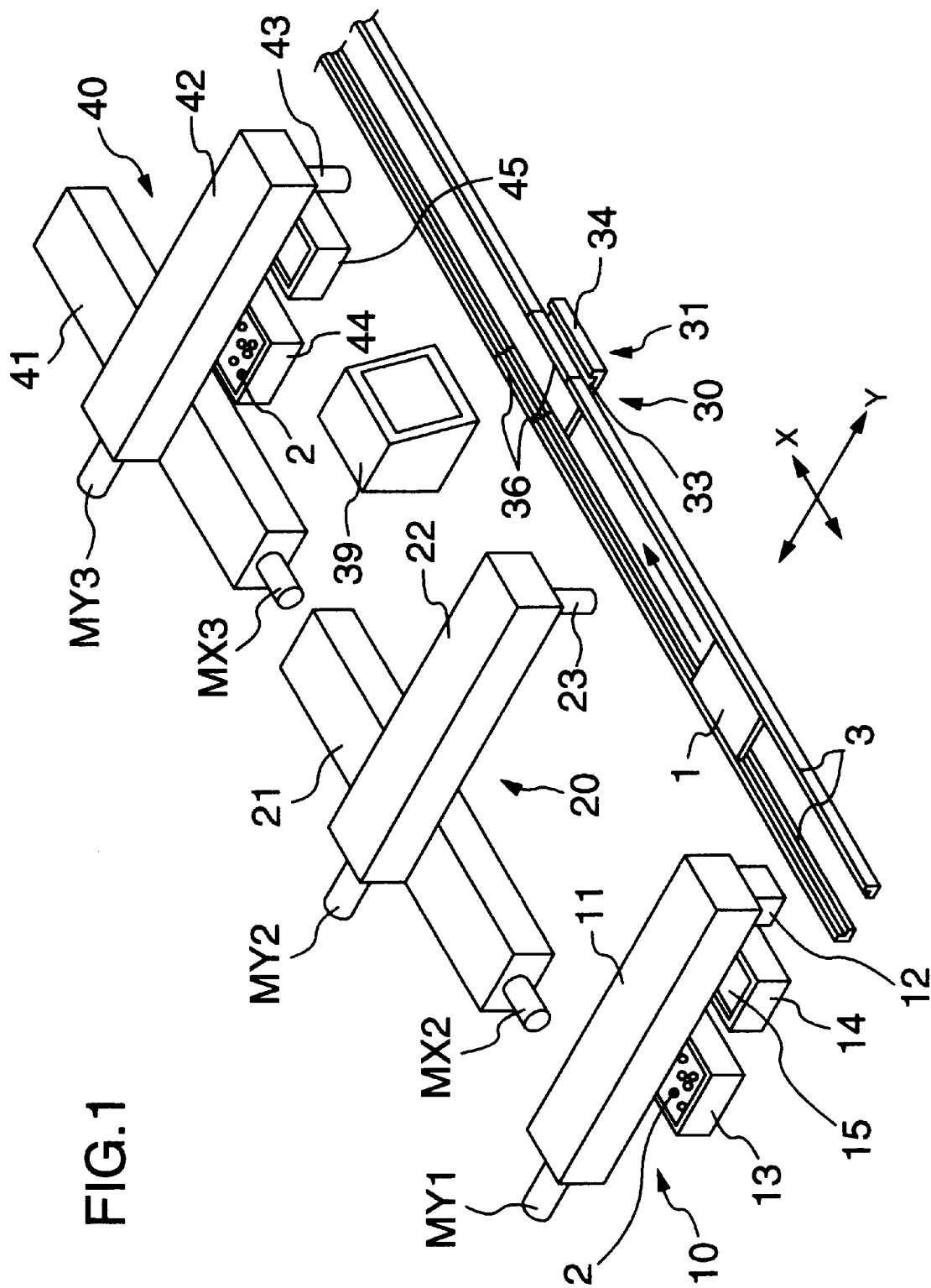
FIG. 1 is a perspective view of a conductive ball-mounting apparatus of a preferred embodiment according to the present invention.

A preferred embodiment of the present invention will now be described with reference to the drawings.

An overall construction of a conductive ball-mounting apparatus will first be described with reference to FIG. 1. A workpiece 1 is transferred right along a transfer path 3 formed by rails. A conductive ball-mounting machine 10, an inspecting device 20, a repair stage 30, and a repairing machine 40 are arranged along the transfer path 3 in this order from upstream to downstream.

The mounting machine 10 comprises a movable table 11, and a head 12 mounted on the movable table 11. MY1 denotes a drive motor for the movable table 11. Many suction holes (not shown) are formed in a matrix-like pattern in a bottom surface of the head 12. The head 12 is driven by the movable table 11 to move in a direction Y, and holds electrically-conductive balls 2, stored in a conductive ball supply portion 13, by suction (vacuum) through the suction holes, and picks up these conductive balls 2. Then, the head 12 is moved to a position above a flux-coating portion 14, and causes a flux 15 to be coated on lower surfaces of the conductive balls 2 held by the head 12. Then, the head 12 is moved to a position above the workpiece 1 on the transfer path 3, and then the conductive balls 2, held by the head 12, are mounted on the workpiece 2. In this embodiment, the direction of transfer of the workpiece 1 along the transfer path 3 is a direction X, and the direction perpendicular to the direction X is the direction Y.

The inspecting device 20 comprises a movable table comprising an X-table 21 and a Y-table 22. MX2 denotes a drive motor for the X-table 21, and MY2 denotes a drive motor for the Y-table 22. A camera 23, serving as optical inspecting means, is mounted on the Y-table 22. For example, a linear sensor other than the camera 23 can be used as the optical inspecting means.

Figure 5:
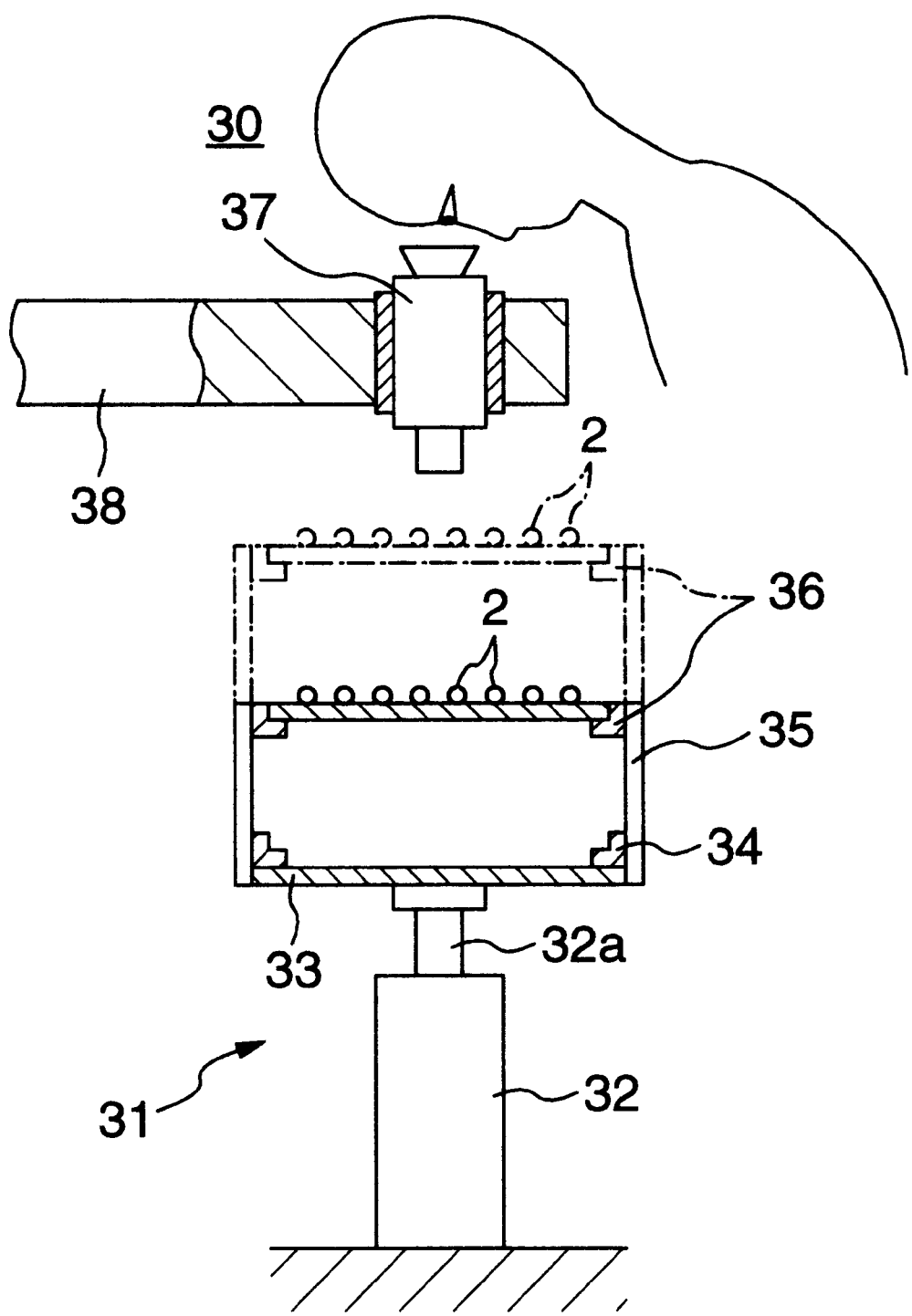
FIG. 5 is a side-elevational view of a repair stage of the conductive ball-mounting apparatus of the embodiment.

Retracting means 31 for retracting the workpiece 1 is provided at the repair stage 30. In FIGS. 1 and 5, the retracting means 31 comprises a cylinder 32, a base plate 33 connected to an upper end of a rod 32a of the cylinder 32, auxiliary rails 34 mounted on the base plate 33, and main rails 36 connected to the auxiliary rails 34 by connecting members 35. Namely, the auxiliary rails 34 and the main rails 36 form multi-stage rails spaced vertically from each other. In FIG. 1, the retracting means 31 is broadly illustrated.

When the rod 32a of the cylinder 32 is in a retracted condition as indicated in solid lines in FIG. 5, the main rails 36 are disposed at the same level as that of the transfer path 3, and are connected to the transfer path 3, and in this condition the workpiece 1 is moved or transferred on the main rails 36. When the rod 32a is extended upwardly, the main rails 36 are moved or retracted upwardly from the transfer path 3 (as indicated by broken lines in FIG. 5), so that the auxiliary rails 34 are disposed at the same level as that of the transfer path 3. When the defective workpiece 1 is transferred along the transfer path 3 to the main rails 36, the rod 32a of the cylinder 32 is extended to move the main rails 36 upward, so that the defective workpiece 1 on the main rails 36 is retracted upwardly from the transfer path 3 (as indicated by the broken lines in FIG. 5). Then, the operator repairs this defective workpiece 1 held in this retracted position. During this time, the good workpiece 1 is transferred downstream to pass the auxiliary rails 34. In FIG. 1, the retracting means 31 is illustrated broadly.

In FIG. 5, a microscope 37 is provided at the repair stage 30. The microscope 37 is mounted on a movable table 38, and the operator observes the defective work-piece 1 through the microscope 37 while moving the microscope 37 in the directions X and Y, and repairs this defective workpiece 1. A monitor television 39 is provided at the repair stage 30 (FIG. 1). Results of the inspection, effected by the inspecting device 20, are displayed on the monitor television 39.

In FIG. 1, the repairing machine 40 comprises a movable table comprising an X-table 41 and a Y-table 42. MX3 denotes a drive motor for the X-table 41, and MY3 denotes a drive motor for the Y-table 42. A repairing head 43 is mounted on the Y-table 42. By driving the X-table 41 and the Y-table 42, the head 43 is moved horizontally in the X-direction and Y-direction. The head 43 holds one of conductive balls 2, stored in a conductive ball supply portion 44, by suction (vacuum), and picks up this conductive ball 2. Then, the head 43 causes a flux, held in a flux-coating portion 45, to be coated on a lower surface of the conductive ball 2 held by the head 43, and then mounts the conductive ball 2 on the defective portion of the workpiece 1.

Figure 2:
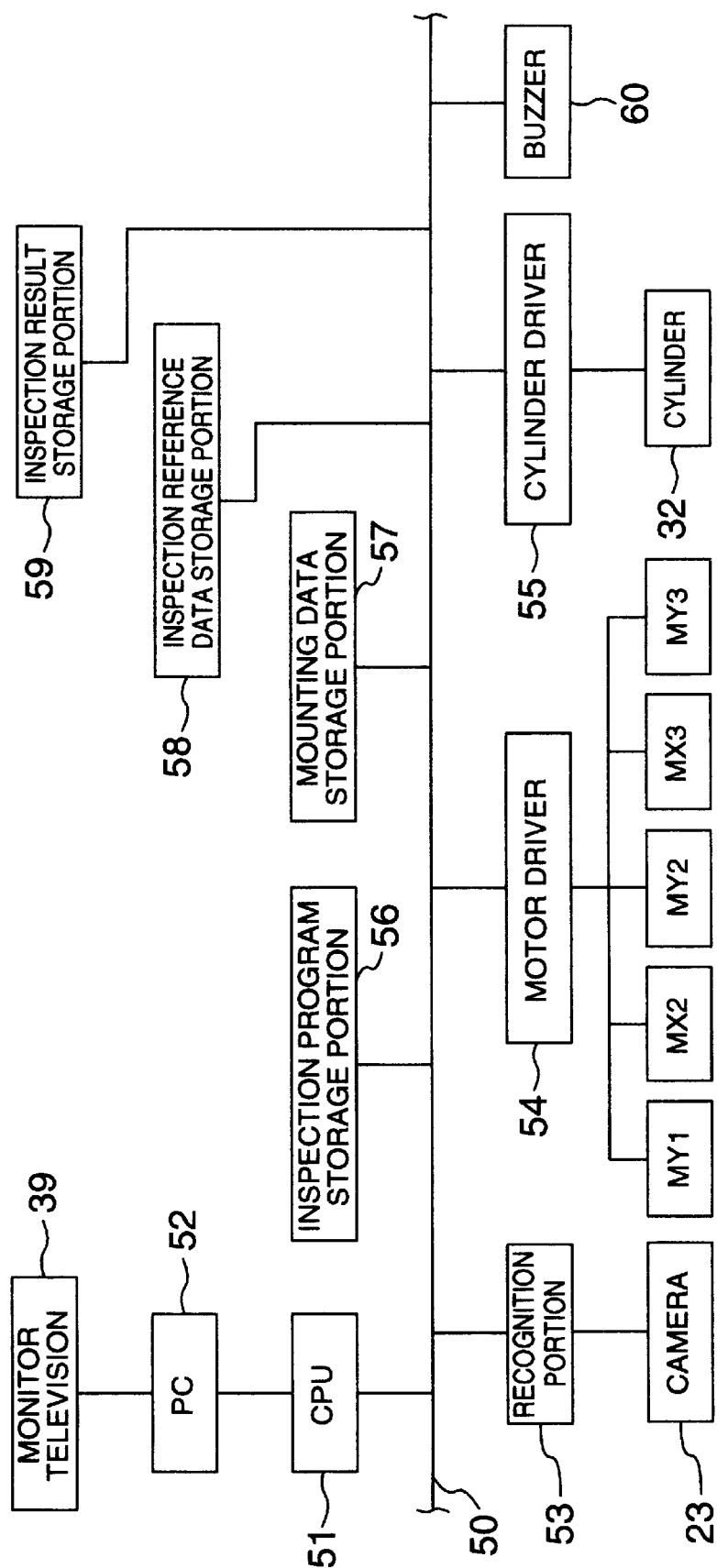
FIG. 2 is a block diagram of a control system of the conductive ball-mounting apparatus of the embodiment.

Next, a control system will be described with reference to FIG. 2. Reference numeral 50 denotes a bus to which elements described below are connected. A CPU 51 effects the overall control, and the monitor television 39 is connected to this CPU 51 via a personal computer 52. The camera 23 is connected to the bus 50 via a recognition portion 53. The motors MY1, MX2, MY2, MX3 and MY3 are connected to the bus 50 via a motor driver 54. The cylinder 32 (FIG. 5) is connected to the bus 50 via a cylinder driver 55. Reference numeral 56 denotes an inspection program storage (memory) portion, reference numeral 57 denotes a mounting data storage portion, reference numeral 58 denotes an inspection reference data storage portion, reference numeral 59 denotes an inspection result storage portion, and reference numeral 60 denotes a buzzer (alarm device) for telling the operator of whether the workpiece is good or defective. A drive portion for the movable table 38 (FIG. 5) and others are omitted in FIG. 2.

FIGS. 3A to 3D show images of a portion of the workpiece 1 picked up by the camera 23. A number of mounting areas Ar are provided in a matrix-like pattern on the workpiece 1, and one conductive ball 2 is mounted at a central portion of each mounting area Ar. The camera 23 picks up the image of each of the mounting areas Ar. In this embodiment, the image is a binary (light and darkness) image, and the conductive ball 2 is observed as a bright portion in the dark background.

In FIG. 3A, the condcutive ball 2 is disposed at the central portion of the mounting area Ar, and this condition is normal (OK). In FIG. 3B, the conductive ball 2 is disposed much out of registry with the central portion of the mounting area Ar, and this condition is not good (NG). In FIG. 3C, a plurality of conductive balls 2 are disposed at the mounting area Ar, and this condition is an overloaded condition, and therefore not good. In FIG. 3D, no conductive ball 2 is disposed at the mounting area Ar, and this condition is not good. Data of a value of the allowance for the misregistration of the conductive ball 2, and other data are stored in the inspection reference data storage portion 58.

FIG. 4 is a view showing the screen of the monitor television 39. In this embodiment, the workpiece 1 is divided into 49 mounting areas Ar arranged in a matrix-like pattern (that is, in 7 columns (A to G) and 7 rows (01 to 07)). In FIG. 4, those mounting areas Ar (3×3= 9), indicated by cross-hatching, are non-mounting areas at which the conductive ball 2 is not mounted. One conductive ball 2 is adapted to be mounted on each of the other 40 mounting areas Ar. Data as to those of the 49 mounting areas Ar, at which the conductive balls 2 to be mounted, respectively, are beforehand stored in the mounting data storage portion 57.

In FIG. 4, each of the mounting areas Ar is indicated by hatching and so on with respect to its category (the normal condition, the non-mounting area, the ball-absent condition, the misregistration, and the ball overload). Of course, this indication can be made using colors displayed on the screen. The data, representing the inspection results shown in FIG. 4, is stored in the inspection result storage portion 59.

This conductive ball-mounting apparatus has the above construction, and a conductive ball-mounting method will now be described. First, the workpiece 1 is delivered to the mounting machine 10, and the conductive balls 2 in the supply portion 13 are mounted on the workpiece 1 by the head 12. Many conductive balls 2 are mounted respectively on the mounting areas Ar at a time by the head 12.

Figure 6:
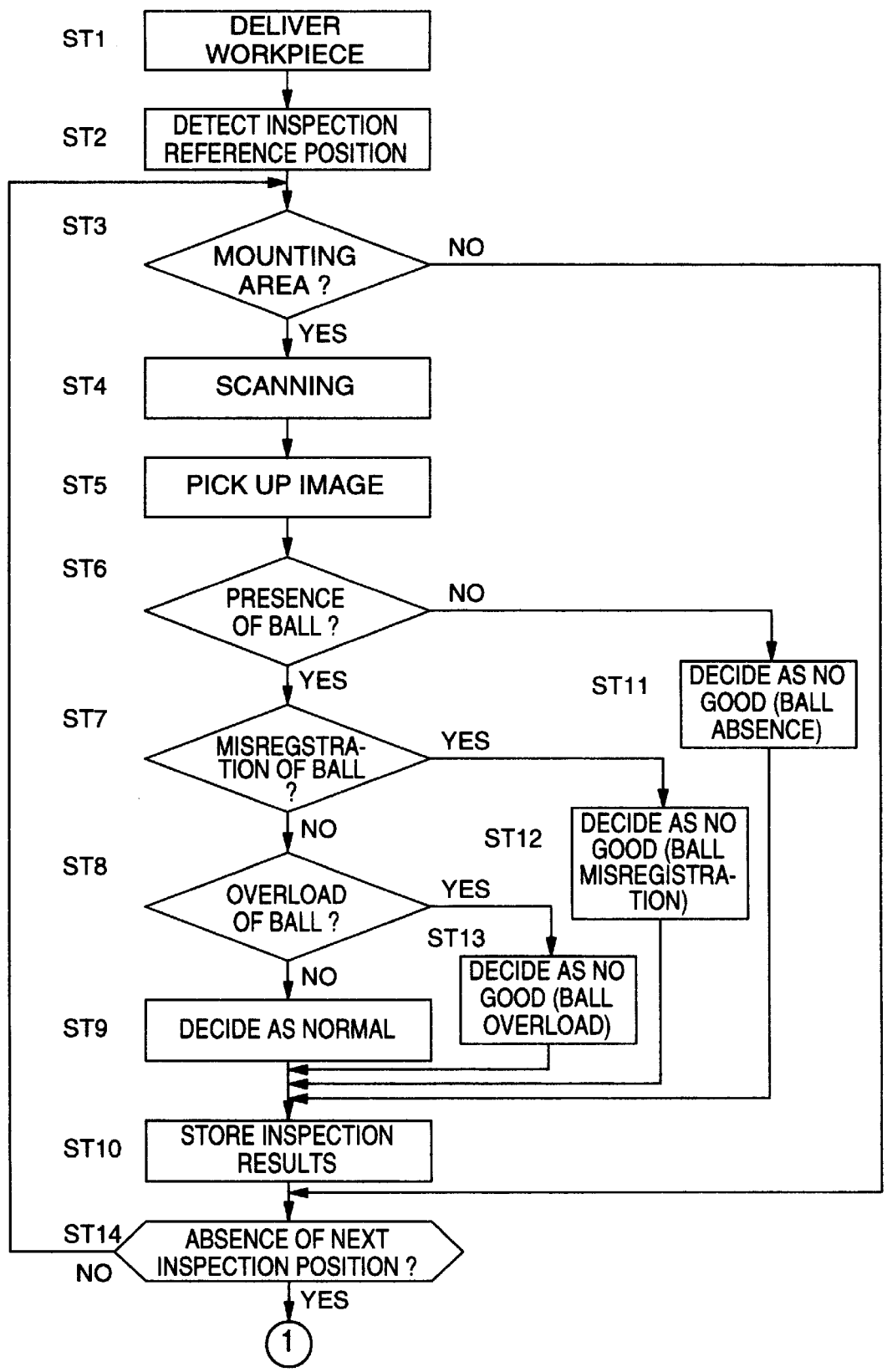
FIG. 6 is a flow chart of the inspection of the conductive balls in the embodiment.
Figure 7:
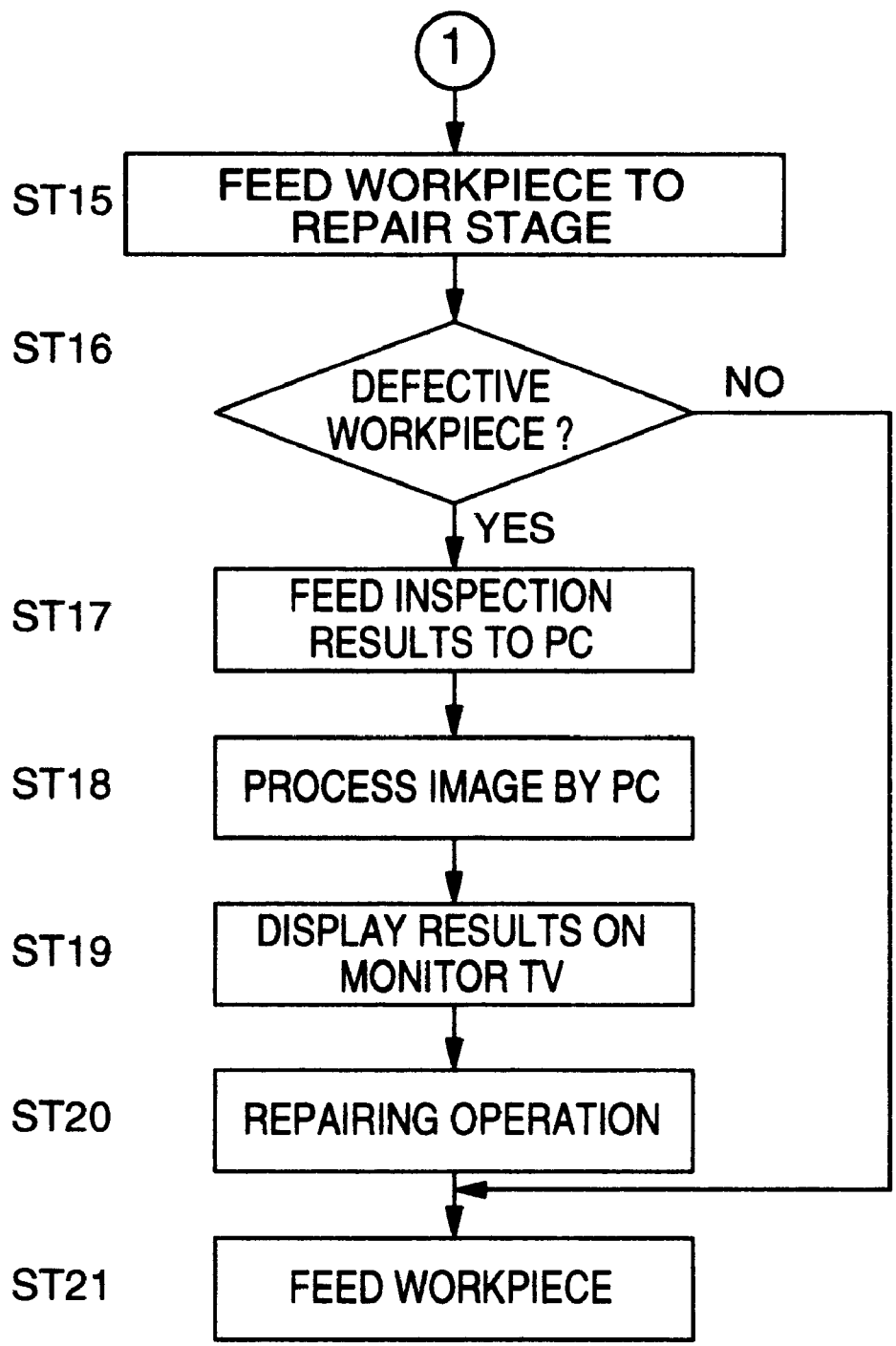
FIG. 7 is a flow chart of the inspection of the conductive balls in the embodiment.

The subsequent operation will be described with reference to flow charts of FIGS. 6 and 7. The workpiece 1, having the conductive balls 2 mounted thereon, is fed to an inspection area of the inspecting device 20 (Step 1). In this inspection area, the camera 23 detects an inspection reference position (Step 2). For detecting the inspection reference position, one (for example, the mounting area (A-01) at the upper left corner in FIG. 4) of the mounting areas Ar on the workpiece 1 is used.

Then, the inspection by the camera 23 is started. First, in Step 3, it is judged whether or not each of the mounting areas of the workpiece is the mounting area. More specifically, it is judged that each of the 49 mounting areas Ar in FIG. 4 is the mounting area, on which the conductive ball 2 is to be mounted, or any of the 9 non-mounting areas (indicated by cross-hatching in FIG. 4). If this judgment result is "No" (the non-mounting area), the program skips to Step 14 since this mounting area is one which is not to be inspected.

If the judgment result in Step 3 is "Yes", the program proceeds to Step 4 in which the mounting area Ar is scanned by the camera 23, and then its image is picked up (Step 5). The picked-up image is registered in the CPU 51. FIGS. 3A to 3D show the picked-up image data. Then, it is judged by the CPU 51 which category (any of those of FIGS. 3A to 3D) the picked-up image belongs to (Steps 6, 7, 8 and 9). The judgment of Steps 6 to 9 can be effected by a known image processing technique. For example, the presence of the ball in Step 6 can be judged from the bright picture elements in the mounting area Ar. The misregistration of the ball in Step 7 can be judged from the position of the center of the bright portion. The overload of the balls in Step 8 can be detected by judging whether or not the area of the bright portion is more than a threshold value. This judgment is effected in Steps 11, 12 and 13. The inspection results are stored in the inspection result storage portion 59.

The above inspection is effected independently for each of the mounting areas Ar (Step 14). When there is no further inspection position, the inspection of this workpiece 1 is completed, and this workpiece 1 is fed onto the main rails 36 of the repair stage 30 (Step 15 in FIG. 7). Here, it is judged whether or not the workpiece 1 is not good (NG) (Step 16). If this judgment result is "No", the workpiece 1 passes the repair stage 30 without stopping, and is fed to a downstream-side stocker (not shown). If the judgment result in Step 16 is "Yes", the buzzer 60 is operated to tell the operator of this fact, and at the same time the rod 32a of the cylinder 32 is extended to move the main rails 36 upward, thereby retracting the workpiece 1 from the transfer path 3. At the same time, the inspection results are fed from the inspection result storage portion 59 to the personal computer 52 (Step 17), and the image processing operation is effected by the personal computer 52 (Step 18), and the inspection results are displayed on the monitor television 39 (Step 19). FIG. 4 shows this display screen.

Then, the operator manually effects the repairing operation using a jig. In this case, at a glance at the screen of the monitor television 39, the operator can easily recognize those of the 49 mounting areas Ar (arranged in a matrix-like pattern), subjected to mounting errors, and the category of such errors. In the example shown in FIG. 4, the mounting area (E-01) is subjected to the misregistration of the ball 2, the mounting area (B-04) is subjected to the absence of the ball 2, and the mounting area (G-07) is subjected to the overload of the balls 2. Therefore, the operator effects the repairing operation by the use of the jig (such as a pin and a forceps) while viewing the workpiece 1 through the microscope 37.

During this repairing operation, the auxiliary rails 34 are disposed at the same level as that of the transfer path 3, and the subsequent good workpiece 1 is transferred downstream past the auxiliary rails 34. When the repairing operation is finished, a manual button (not shown) is operated to retract the rod 32a of the cylinder 32, thereby bringing the main rails 36 to the same level as that of the transfer path 3, and the repaired workpiece 1 is transferred downstream.

In the case where the mounting area is subjected to the absence of the ball 2 as shown in FIG. 3D, the operator may not repair this mounting error (that is, may not mount the ball 2 on this mounting area Ar) at the repair stage 30, and instead the mounting of the ball 2 on this mounting area Ar may be effected by the repairing machine 40 at the next stage. Namely, all of the repairing operations do not always need to be effected by the operator, and the repairing operation may be effected automatically using the repairing machine 40.

The present invention is not limited to the embodiment described above and shown in the drawings, and various modifications can be made without departing from the scope of the appended claims.

What is claimed is:

1. A conductive ball-mounting method comprising the steps of:
   (a) transferring a workpiece along a transfer path;
   (b) mounting a plurality of electrically-conducive balls in a matrix-like pattern on the workpiece by a mounting machine;
   (c) optically inspecting the workpiece, fed from said mounting machine, by an inspecting device with respect to each of conductive ball-mounting areas of the workpiece so as to determine whether or not the conductive balls have been properly mounted respectively on said conductive ball-mounting areas; and
   (d) if the workpiece is determined to be defective in step (c), once stopping the defective workpiece, fed from said inspecting device, at a repair stage, and retracting said defective workpiece from said transfer path by retracting means, and displaying results of the inspection, effected by said inspecting device, on a monitor television provided at said repair stage, and performing a repairing operation on said defective workpiece while viewing said monitor television.

2. A method according to claim 1, in which said inspecting device detects a defect category for each of said mounting areas, said defect categories including an absence of the conductive ball, a misregistration of the conductive ball and an overload of the conductive ball, and results of inspecting the workpiece are displayed on said monitor television.

3. A method according to claim 1, in which during the repairing operation in which said defective workpiece is retracted from said transfer path and repaired on said repair stage, a subsequent good workpiece is transferred downstream past auxiliary rails.

* * * * *